United States Patent
Metzger et al.

(10) Patent No.: US 11,296,673 B2
(45) Date of Patent: Apr. 5, 2022

(54) COMPONENT WITH A THIN-LAYER COVERING AND METHOD FOR ITS PRODUCTION

(71) Applicant: SNAPTRACK, INC., San Diego, CA (US)

(72) Inventors: Thomas Metzger, Munich (DE); Akifumi Kamijima, Yamanashi (JP)

(73) Assignee: SnapTrack, Inc., San Diego, CA (US)

( * ) Notice: Subject to any disclaimer, the term of this patent is extended or adjusted under 35 U.S.C. 154(b) by 500 days.

(21) Appl. No.: 16/311,823

(22) PCT Filed: Jun. 26, 2017

(86) PCT No.: PCT/US2017/039257
§ 371 (c)(1),
(2) Date: Dec. 20, 2018

(87) PCT Pub. No.: WO2018/005351
PCT Pub. Date: Jan. 4, 2018

(65) Prior Publication Data
US 2019/0229703 A1    Jul. 25, 2019

(30) Foreign Application Priority Data

Jun. 29, 2016 (DE) .................... 102016111914.8

(51) Int. Cl.
*H03H 9/10* (2006.01)
*B81B 7/00* (2006.01)
*H03H 3/007* (2006.01)

(52) U.S. Cl.
CPC ........... *H03H 9/1007* (2013.01); *B81B 7/007* (2013.01); *H03H 3/007* (2013.01);
(Continued)

(58) Field of Classification Search
CPC .. H03H 9/1007; H03H 9/1064; H03H 9/1078; H03H 9/1057; B81B 7/007;
(Continued)

(56) References Cited

U.S. PATENT DOCUMENTS

2010/0072626 A1*  3/2010  Theuss ............... H01L 25/16
                                                         257/774
2010/0075481 A1   3/2010  Yang
(Continued)

FOREIGN PATENT DOCUMENTS

JP    2008187451 A    8/2008
WO    2008132212 A2   11/2008
(Continued)

OTHER PUBLICATIONS

International Search Report and Written Opinion—PCT/US2017/039257—ISA/EPO—dated Oct. 6, 2017.
(Continued)

*Primary Examiner* — Jeffrey M Shin
(74) *Attorney, Agent, or Firm* — SnapTrack, Inc.

(57) ABSTRACT

A component (B) comprising a carrier (TR), on which a functional structure (FS) is covered by a thin-layer covering (DSA) spanning across and resting on the carrier. On a planarization layer arranged above the thin-layer covering (DSA), a wiring level (M1, M2) is realized, which comprises structured conductor paths and which is connected via through-connections to the functional structure (FS).

13 Claims, 4 Drawing Sheets

(52) U.S. Cl.
CPC ........ *H03H 3/0072* (2013.01); *H03H 9/1057* (2013.01); *H03H 9/1064* (2013.01); *H03H 9/1078* (2013.01); *B81B 2207/095* (2013.01); *B81C 2203/0136* (2013.01); *B81C 2203/0145* (2013.01)

(58) Field of Classification Search
CPC ...... B81B 2207/095; B81C 2203/0136; B81C 2203/0145
See application file for complete search history.

(56) References Cited

U.S. PATENT DOCUMENTS

| | | |
|---|---|---|
| 2012/0241981 A1 | 9/2012 | Hirano |
| 2012/0248544 A1* | 10/2012 | Yokoyama ............ H01L 23/481 257/369 |
| 2015/0380634 A1 | 12/2015 | Henn et al. |
| 2016/0173059 A1 | 6/2016 | Schmidhammer |
| 2018/0013055 A1 | 1/2018 | Meizger et al. |

FOREIGN PATENT DOCUMENTS

| | | |
|---|---|---|
| WO | 2010006065 A2 | 1/2010 |
| WO | 2014135309 A1 | 9/2014 |
| WO | 2014135442 A1 | 9/2014 |
| WO | 2016134803 A1 | 9/2016 |

OTHER PUBLICATIONS

Pickert J., et al., "Surface Mount Technology—The future of Electronic Assembly," IEEE Circuits and Devices Magazine, IEEE Service Center, Piscataway, NJ, US, Mar. 1, 1987, vol. 3, No. 2, XP011466708, ISSN: 8755-3996, DOI: 10.1109/MCD.1987.6323236, pp. 33-41.

* cited by examiner

COMPONENT WITH A THIN-LAYER COVERING AND METHOD FOR ITS PRODUCTION

CROSS-REFERENCE TO RELATED APPLICATIONS

This application is a national stage application under 35 U.S.C. 371 of PCT/US2017/039257, filed Jun. 26, 2017, which claims the benefit of German Patent Application Serial No. 102016111914.8, filed on Jun. 29, 2016, both of which are incorporated herein by reference in their entireties.

The invention relates to a component with functional layers covered by a thin-layer covering as well as to a method for its production.

MEMS components and especially micro-acoustic components require a package, in which the functional structures of the component are protected in a mechanically secure manner and preferably encapsulated in a cavity. For producing such a package, various technologies are known, which can already be carried out at the wafer level and, therefore, allow for a cost-effective parallel processing of the components on the wafer level. It is, for example, possible to apply a wafer with component chips produced thereon onto a carrier, such as a laminate or a multilayer ceramic, in a flip chip design and to seal it against the carrier using a cover layer. It is also possible to arrange the functional structures of the component in a frame and to use this frame as a housing wall and spacer for a cover wafer.

A cost-effective method, which in addition leads to components having a small construction height, are the packages called TFP (thin film package), in which the functional structures are covered by means of a mechanically stable thin-layer design. The cavity is provided by a structured sacrificial layer, which is covered together with the functional structures by the thin-layer covering, defining the cavity underneath the thin-layer covering, and being dissolved away again through structure openings in the thin-layer covering in a subsequent method step. In another step, the structure openings are sealed again.

Besides the cost advantages and the small dimensions of the TFP, such components, however, also have disadvantages. The connecting faces of a component encapsulated in this way are arranged on the chip surface, that is, between the thin-layer coverings on the surface of the carrier. In order to solder such a component to a circuit environment, e.g. a circuit board, bumps must then be used, which have a sufficient stand-off, which must have at least the height of the thin-layer covering plus a tolerance value.

It is, furthermore, disadvantageous that the technically most advantageous arrangement of the connecting faces on the carrier does not necessarily coincide with a required footprint as is customary for standardized components. In addition, a bump requires a relatively large area, which is, however, limited on the surface of the carrier, especially in the case of miniaturized components. If the distribution of the connecting faces on the carrier is adapted to a required footprint, the conductor paths required for this purpose take up additional space on the surface of the carrier, which further increases the size of the component.

The task of the present invention is, therefore, to specify a component with a thin-layer covering, whereby the component avoids the aforementioned disadvantages.

This task is achieved according to the invention by a component having the features of claim 1. Advantageous embodiments of the invention and a method for producing the component are to be learned from additional claims.

A component is specified, in which a functional structure on a carrier is covered by a thin-layer covering spanning across said structure. A planarization layer is applied over the thin-layer covering, and a wiring level, which is electrically connected to the functional structure, is applied over the planarization layer.

In this way, sacrificing valuable space on the surface of the carrier for connection purposes is avoided so that the space required for this purpose is saved on the carrier. In addition, the wiring level makes possible connection, rewiring and any arbitrary placement of contacts, via which the component can be connected to a circuit environment.

Another advantage is that electrical connections required for connecting functional structures can be led on the shortest path within the wiring level, whereas such connections have often been possible only on circuitous paths around the structures so far. For a similar reason, the freedom of design for the functional structures on the carrier itself is also increased by the invention, since the course of the conductor paths does no longer have to be taken into consideration for electrical connections on the carrier. The surface space on the carrier can thus also be saved, which constitutes a cost advantage, especially for active surfaces on semiconductor substrates or other crystalline substrates, such as on piezoelectric substrates, since more active surface means more costs for the production of the component alone.

The proposed wiring level is compatible with all thin-layer coverings and can even expand and improve their functionality. This especially applies to the thin-layer coverings known under the terms TFP (thin film package) and TFAP (thin film acoustic package).

The wiring level comprises structured conductor paths, which are connected to at least one connecting face on the surface of the carrier but preferably connect two or more connecting faces on the surface of the carrier to one another. The connecting faces on the surface constitute the connectors of the functional structure on the carrier, wherein the connection of the different connectors of the functional structure is implemented in the wiring level.

In one embodiment, solderable connecting pads connected to the wiring level are arranged in the wiring level. In the process, the planarization level allows for all connecting pads to be able to be arranged in one and the same level, which makes possible a simple connection to a circuit environment, such as a circuit board or a PCB. The connecting pads can be arranged at the highest point of the component so that a stand-off is no longer required as has been the case so far for thin-layer coverings. This allows for a minimum size of the connecting means, such as minimum bump sizes. They have the additional advantage that the stand-off for the connection of the connecting pads to a circuit environment must no longer take into account the stand-off required by the component height in previous thin-layer coverings with connecting pads on the carrier. Solderable connecting pads, which constitute bus bars for a series of connecting faces, can thus reduce the number of external connectors.

Furthermore, all solderable connecting pads required for the component can be arranged in the wiring level so that solderable connecting pads are no longer required on the carrier. Since connecting pads require more surface than normal connecting faces, this results in more saving of active surface with the invention.

The connecting faces on the carrier can be connected using a simple connection.

The connecting faces arranged externally to the thin-layer covering on the carrier are connected to the functional structure and, via a through-connection, to the wiring level. For this purpose, a metallization is simply brought into contact with the wiring level and the connecting face. The through-connection can, therefore, be realized as a recess in the planarization layer, which is provided with a metallization only on the side walls. The through-connection can, however, also be filled completely with metal and thus constitute a via.

It is, furthermore, possible with the planarization layer and the wiring level arranged thereon to place larger connecting pads in almost any arbitrary location in the wiring level. This facilitates or allows for producing any arbitrary footprint, i.e. any arbitrary pin pattern, for the connection of the component and thus for carrying out an adaptation of the technically required, optimal distribution of the connecting faces on the level of the functional structure to a desired pin pattern or a desired footprint for a circuit environment.

The placing of the connecting means on larger contact pads is, moreover, easier, so that a simpler mutual adjustment of the component in or with a circuit environment is possible.

In one embodiment of the invention, the thin-layer covering comprises several partial layers. One of the partial layers is a mechanically stable layer, which can ensure the stability of the cavity enclosed thereunder at least for the next method steps. Another partial layer serves as a sealing layer for sealing the structure openings, which are conducted through the mechanically stable layer in order to dissolve away the sacrificial layer underneath the thin-layer covering. The first wiring level is preferably arranged between two partial layers of the thin-layer covering, i.e. integrated into the structure of a traditional thin-layer covering.

The number of the connecting faces and of the solderable connecting pads can be different, since several connecting faces can be connected to the same connecting pad. In addition or alternatively, the connecting faces and the connecting pads have a different distribution or a different connection pattern.

The invention is preferably used for components that require a cavity above their functional structures in order to function free of interference. The functional structure can, therefore, advantageously be selected from a MEMS structure, a micro-acoustic structure, a SAW structure, a BAN structure, or a GBAW structure.

A MEMS structure comprises a micro-structured 3D structure, which is preferably produced from a crystalline semiconductor body and which comprises at least one movable part, such as a membrane or a contact tab.

In the form of suitable transducer structures, a SAW structure can be applied directly on a carrier comprising a piezoelectric material. The carrier can be a piezoelectric wafer or a piezoelectric chip separated therefrom. The carrier can, however, also comprise a non-piezoelectric, mechanically stable material, such as silicon or glass, onto which a piezoelectric layer or a layer system comprising a piezoelectric layer is applied.

For a BAW structure, a layer sequence is applied onto the carrier, whereby the layer sequence comprises, for example, an acoustic mirror, a first electrode above it, a piezoelectric layer, and a second electrode. The acoustic mirror comprises at least a pair of layers with respectively relatively high and relatively low acoustic impedance, whereby the layers are formed on the one hand from a hard metal and on the other hand from a lightweight material, such as $SiO_2$, polymer, or aluminum.

A GBAW structure comprises an electro-acoustic transducer and an acoustic waveguide layer, which can be arranged above or underneath the transducer electrodes.

The component can comprise a plurality of functional structures, which work with acoustic waves and which are connected in the wiring level to form an HF filter. The functional structures can be covered individually by thin-layer coverings, but it is also possible to arrange several functional structures under a common covering. Such microacoustic structures can, for example, be interdigital transducers and resonators.

The wiring level at least comprises structured conductor paths, but can additionally also comprise circuit components connected thereto, whereby the circuit components can also be present on the surface of the planarization layer. Such circuit components can be passive circuit components, such as resistance structures, capacitances, or inductances, which can consist of correspondingly structured conductor path segments. Such circuit components can supplement or expand the function of the component. They can be produced in a manner integrated into the wiring level.

The thin-layer covering can be used variably and can be used for covering individual functional structures or entire groups of functional structures. It is crucial that the thin-layer covering still remains sufficiently mechanically stable if it spans across a relatively large area with functional structures. At least one dimension of a, for example, rectangular or approximately rectangular thin-layer covering should in this respect not exceed the limit value for sufficient mechanical stability.

A component that works with acoustic waves and that comprises transducer structures producing acoustic waves as functional structures, better electroacoustic transducers, often comprises several functional structures that are acoustically separated from one another and only connected to one another electrically. In such cases, it can be advantageous to provide individual functional structures with a respective separate thin-layer covering.

By means of the invention, it is now possible to connect the individual functional structures in the wiring level above the planarization level to one another.

EXEMPLARY EMBODIMENTS AND DESCRIPTION OF THE FIGURES

A method for producing a component according to the invention with a thin-layer covering and a wiring level is explained below with reference to the exemplary embodiments and the associated figures. The figures are used solely for a better understanding of the invention, and are, therefore, partially only schematic and not true to scale. For a better understanding, individual parts can be illustrated in an enlarged or scaled-down manner.

Shown are.

FIGS. 1A to 1E show, by means of various schematic cross sections, various method stages of the method known per se for the production of a known component with traditional thin-layer covering. For this purpose, a functional structure FS, including supply lines and connecting faces AF, is initially produced on a carrier TR. The functional structures FS, for example, constitute transducer structures for an acoustic component, especially an SAW or BAW component.

Figure 1A:
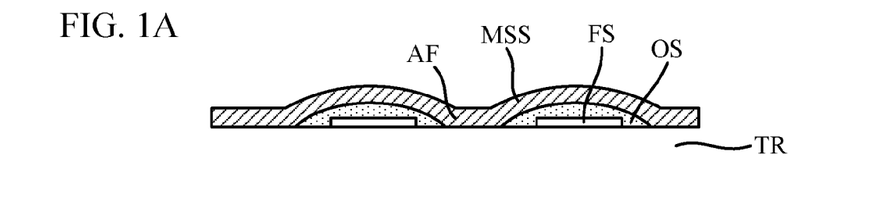
FIGS. 1A through 1E various method stages in the production known per se of a thin-layer covering, FIGS. 2A to 2J various method stages in the production of a component according to the invention with a wiring level, FIG. 3 a component according to the invention in a schematic top view.

Above the functional structures FS, a sacrificial layer OS is now applied and structured such that it defines the areas for the subsequent cavities underneath the thin-layer covering DSA. The sacrificial layer OS preferably comprises an easily structurable material, especially a lacquer layer.

Onto the entire surface of the structured sacrificial layer OS, a mechanically stable layer MSS is now applied, such as a SiO2 layer by means of sputtering or CVD. FIG. 1A shows the component at this method stage.

Figure 1B:
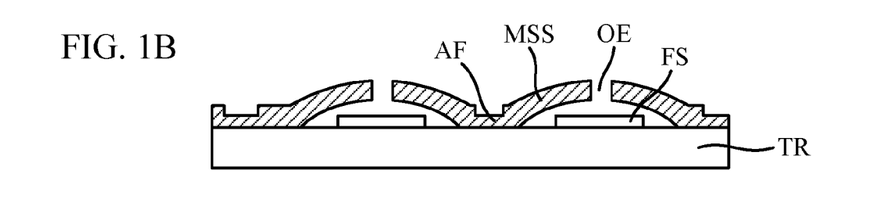

Subsequently, openings OE are produced in the mechanically stable layer MSS; through these openings, the sacrificial layer underneath the mechanically stable layer MSS can now be dissolved away. One or more openings OE can be provided for each provided cavity or for each thin-layer covering DSA. FIG. 1B shows the arrangement at this method stage.

Figure 1C:
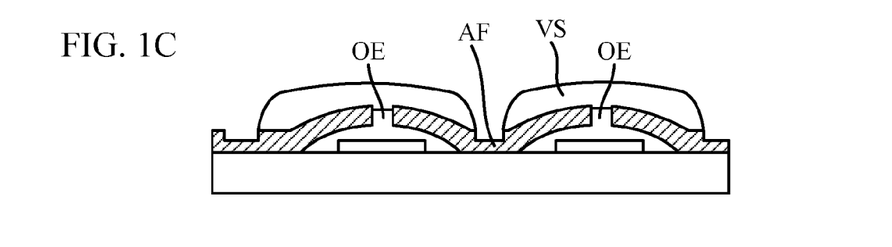

In the next step, the openings OE are sealed using a sealing layer VS. The sealing layer VS is preferably applied onto the entire surface and subsequently structured, exposing the connecting faces AF as shown in FIG. 1C. The cavity is thus sealed in an air-tight manner.

The sealing layer VS is preferably an organic lacquer or a polymer.

Figure 1D:
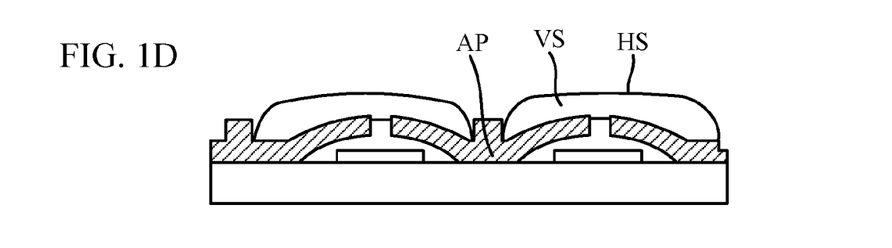

FIG. 1D shows the arrangement after the production of a hermetic layer HS above the sealing layer VS as well as after the production of solderable connecting pads AP directly above the connecting faces AF on the surface of the carrier TR. The sequence for the production of the connecting pads AP and the hermetic layer HS can also be switched.

The hermetic layer HS is preferably a thick and electrically insulating layer, especially a silicon nitride layer.

Figure 1E:
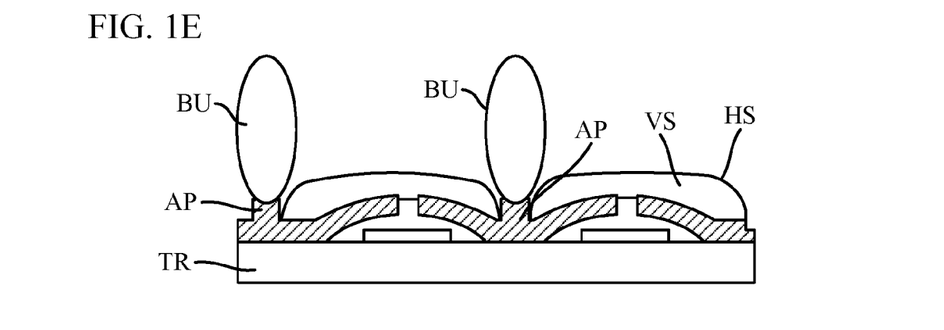

FIG. 1E shows the connection of such a component provided with a thin-layer covering DSA by means of bumps BU, which are produced above and in contact with the solderable connecting pads AP. The bumps U can be stud bumps or solder bumps. In this known embodiment, the bumps must be sufficiently large and especially sufficiently high so that they project above the thin-layer covering DSA and still have a sufficient stand-off of the component relative to the circuit environment after the soldering of the component.

A method for the production of a component according to the invention with a thin-layer covering is specified below and explained in more detail using different method stages illustrated in FIGS. 2A to 2J.

Figure 2A:
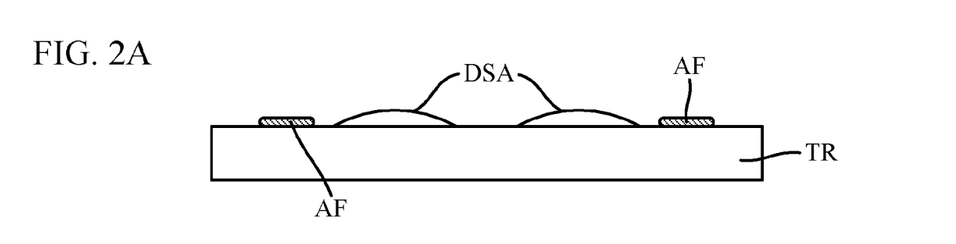

FIG. 2A shows a component provided with a thin-layer covering DSA as can be obtained in a known method, for example according to FIG. 1C. Underneath the possibly multilayer thin-layer covering, functional structures of the component are embedded into a cavity. The functional structures are connected via supply lines (not shown) to connecting faces AF on the surface of the carrier. The connecting faces can consist of a traditional metallization as can be used for normal connecting lines on a component.

Figure 2B:
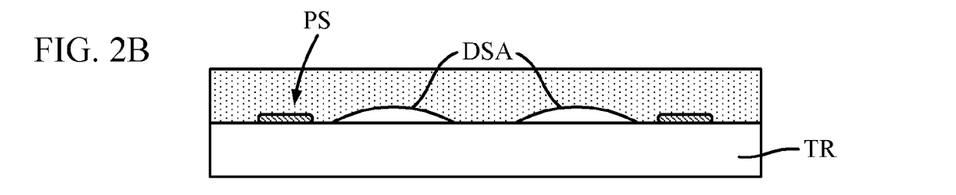

A planarization layer PS is now applied above this arrangement. This planarization layer comprises a lacquer, a polymer, or a different organic compound.

The planarization layer PS can be applied using different methods, such as by spin coating using spin-on materials having good planarization properties. It is also possible to laminate organic materials, especially thin films. This does not necessarily have to directly result in a planar surface. Rather, it is possible to apply a polymer or a lacquer in any manner onto the surface of the carrier TR and planarize it subsequently. The application can be carried out by imprinting, appliquéing, or even via the gas phase, for example by means of PECVD or PVD.

The planarization process of a not completely planar organic layer can be carried out, for example, via chemical-mechanical planarization (CMP). The planarization layer is preferably applied or planarized such that it subsequently has local layer thickness deviations of less than 5 µm. The thickness of the planarization layer is at least adjusted high enough for the thin-layer covering DSA to still be covered by a sufficient layer thickness.

Figure 2C:
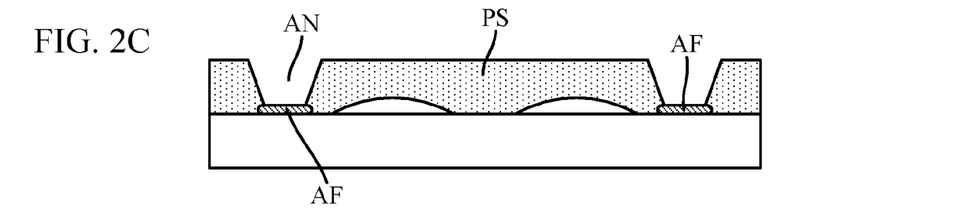

In the next step, recesses AN of the planarization layer PS are produced. On the bottom of the recesses, the connecting faces AF on the surface of the carrier TR are exposed. The recesses can be defined and produced using photolithography. It is, for example, possible to apply a photomask onto the planarization layer PS and structure it. In the areas of the planarization layer PS not covered by the photomask, the planarization layer can be removed to produce the recesses AN, for example using a solvent or by means of etching. In doing so, wet and dry etching methods are possible.

The recesses AN can be produced in any arbitrary cross section, they must have a sufficiently large cross-sectional area in order to later use such recesses as a basis for a through-connection. FIG. 1C shows the arrangement at this method stage.

It is advantageous to use for the planarization layer PS a material that can be transformed in a curing process into a more resistant structure, toughening it in order for the planarization layer to remain on the component. In the uncured state, the structuring of the planarization layer is thereby also facilitated. Subsequently to the production of the recesses, the planarization layer PS can then be cured, for example by the effect of heat and/or radiation, for example using UV light. Subsequently, a treatment with a plasma can optionally be performed to remove not completely removed residues of the planarization layer PS from the recesses AN. For this purpose, a $CF_4$- and $O_2$-containing plasma is, for example, suitable.

Figure 2D:
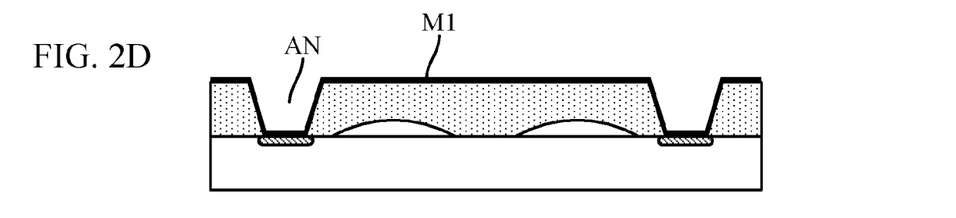

In the next step, a thin metal layer M1 is applied onto the entire surface of the planarization layer such that it also contacts the side walls of the recesses An and the connecting faces AF exposed therein.

This metal layer M1 should be sufficiently tight so that it can serve as a growth layer for a subsequent thicker metallization. The metal layer M1 for the growth layer can be vapor coated, sputtered or produced using a metal-containing seed solution. FIG. 2D shows the arrangement at this method stage.

Figure 2E:
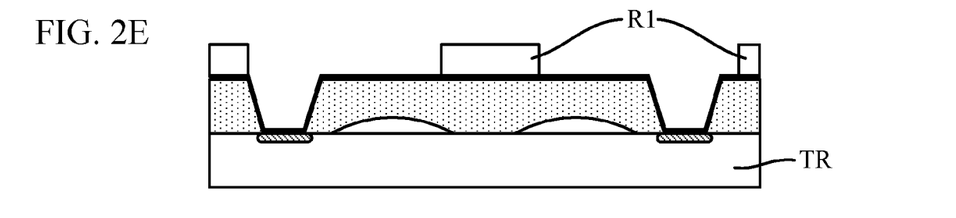

As shown in FIG. 2E, in the next step, a first resist layer R1 is applied and structured such that the conductor paths required for the execution of the wiring level and areas required for other metallic structures remain uncovered. This first resist layer R1 is subsequently used to reinforce, for example, by an electroless method or electroplating, the first metallization M1 by a second metal layer M2 in the exposed areas not covered by the resist layer. For this purpose, a copper layer can be applied galvanically, which is additionally covered by a nickel layer, if necessary.

Figure 2F:
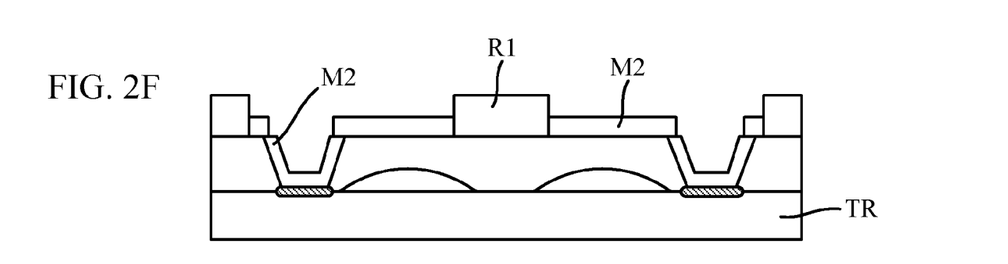

The method is carried out until a sufficiently high layer thickness of the second metal layer M2 is achieved, which ensures a sufficient conductivity within the wiring level. In the recesses, the metallization consisting of a first and second metal layer M1, M2 now has electrical contact with the connecting faces AF, which in turn are connected to the functional structures underneath the thin-layer coverings DSA. On the surface of the planarization layer PS, the conductor paths for the wiring level and optionally also structures for integrated circuit components are now produced from the metallization. In this way, inductances in the form of meandering conductor paths or in the form of helical structures can, for example, be implemented. Capacitances can be implemented via adjacent metallization not electrically connected to one another. Resistances can be implemented via conductor paths with appropriately adjusted conductor path cross sections. FIG. 2F shows the arrangement at this method stage.

Figure 2G:
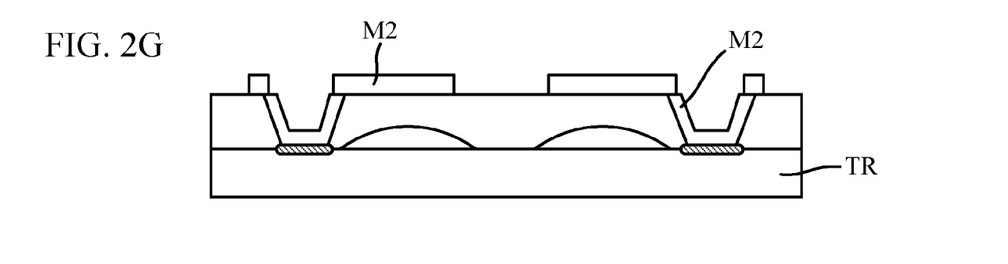

In the next step, the remaining first resist layer R1 is removed and the first metal layer M1 remaining thereunder is removed so that only the metallization in the area of the areas defined by the first resist layer R1 remains. The removal of the first metal layer M1 can be carried out, for example, by wet etching, wherein the adhesion of the thick metallization remains ensured in the other areas. The etching can be carried out such that the surface of the second metallization is roughened at the same time in order to ensure good adhesion to the subsequent connecting pad and the subsequent second resist mask R2 on the second metallization M2. It is, however, also possible to carry out the removal of the first metallization M1 and the roughening of the second metallization M2 in two different steps. FIG. 2G shows the arrangement at this method stage.

Figure 2H:
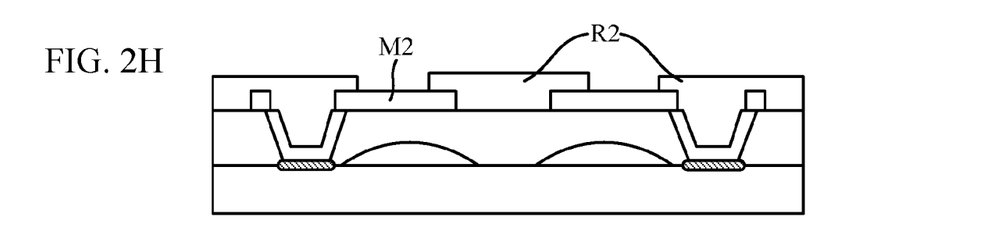

In the next step, a second resist mask R2 is produced in order to define the solderable connecting pads AP. As a resist for the second resist layer, a solder-resistant resist is used, since the second resist layer R2 can remain on the component. The second resist layer R2 has openings, in which the surface of the second metal layer M2 is exposed in the areas provided for the connecting pads AP.

The second resist layer R2 can be applied in a vacuum lamination process. The structuring takes place using photolithography, wherein either the resist itself is a photoresist or a normal resist structured with a photoresist layer. FIG. 2H shows the arrangement at this method stage.

Figure 2J:
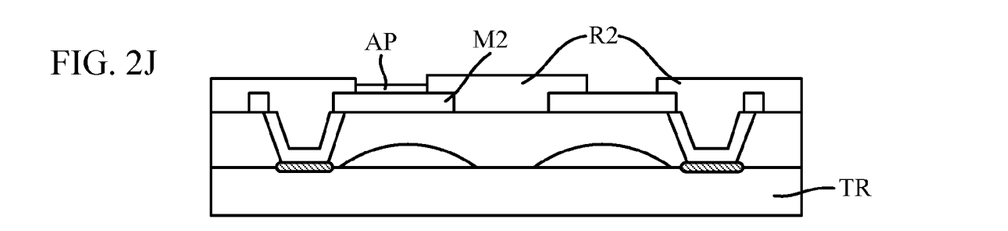

In the next step, the surface of the second metal layer M2 exposed in the openings of the second resist layer R2 is now provided with a solderable layer in order to obtain the solderable connecting pads AP. Since they only require a small layer thickness, an electroless method can be used in this case. The exposed second metal layer M2 can, for example, be reinforced by a thin nickel and/or gold layer.

FIG. 2J shows the component at this method stage, at which it now is connected via its solderable connecting pads AP to an external circuit environment and can be soldered, for example, onto a circuit board.

The method shown in FIGS. 2A to 2J can be performed on the wafer level so that a plurality of components with a possibly even higher number of thin-layer coverings DSA can be processed in parallel.

Subsequently to the method stage shown in FIG. 2J, the components can be separated, for example by sawing along saw lines, in which no structure elements are present on the wiring level or on the surface of the carrier TR.

Figure 3:
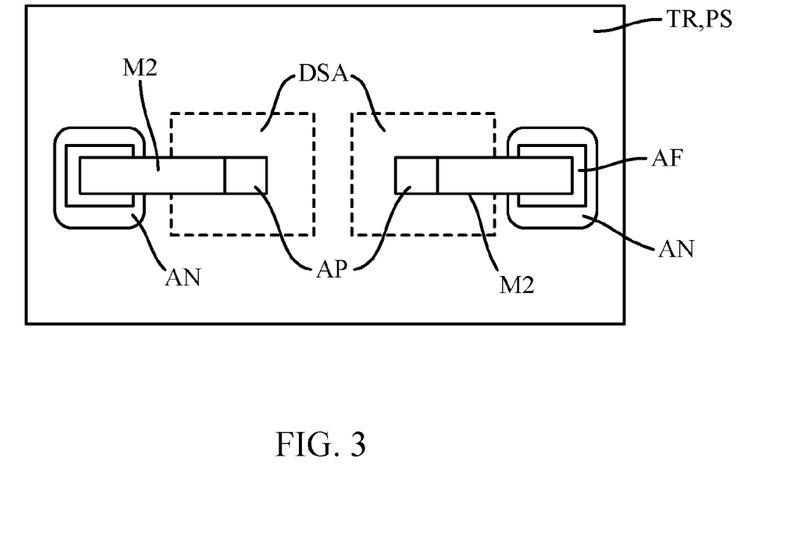

FIG. 3 shows a schematic top view of a possible structure of a component with the wiring level applied onto the planarization layer PS. On the carrier TR, functional structures of the component are arranged (not shown in the figure), whereby the structures are covered by thin-layer coverings DSA. Directly on the carrier, the functional structures are connected to connecting faces AF, which are produced in the form of a suitable metallization on the carrier surface. The carrier TR is covered across the entire surface of the thin-layer coverings by a planarization layer PS, which is only removed in the recesses AN above the connecting faces. There, the connecting faces AF are at least partially exposed.

The metallization M2 produced on the surface of the planarization layer PS at the same time serves to contact the connecting faces AF in the recesses AN.

In the areas intended for the external connection of the component, the metallization is completed by applying a solderable layer to form a solderable connecting pad.

Of the wiring level, FIG. 3 only shows the supply lines, which were formed by the metallization and which connect the connecting faces on the bottom of the recesses AN to the solderable connecting pads AP. In a real component, however, a plurality of such lines is produced in the wiring level, wherein individual connecting pads AP can be connected to a plurality of connecting faces AF and thus to a plurality of functional structures of the component. The wiring level then constitutes an interconnection of the functional structures and is not only used to ensure solderable connections for the functional structures.

Also not shown are the passive circuit components mentioned, which can be produced in the wiring level in a manner integrated into the metallization.

The method steps and component details explained using the figures only specify simple examples for the implementation of the invention so that a component according to the invention is not limited to the embodiments shown in the figures.

| List of Terms and References | |
|---|---|
| B | Component |
| TR | Carrier |
| FS | Functional structure |
| VE1 | First wiring level |
| DSA | Thin-layer covering |
| | Structured conductor paths |
| AF | Solderable connecting face |
| AP | Connecting pad |
| SK | Circuit components |
| TS | Partial layers |
| MSS | Mechanically stable layer |
| VS | Sealing layer |
| HS | Hermetic layer |
| HR | Cavity |
| VE2 | Second wiring level |
| FIL | HF filter |
| MS | Metal layer |
| PL | Electrically insulating layer |
| FF | Free areas |
| UBM | Solderable metallization for solderable connecting face |

The invention claimed is:

1. A component comprising:
   a carrier;
   a functional structure above the carrier;
   a thin-layer covering spanning across the functional structure and resting above the carrier;
   a planarization layer arranged above the thin-layer covering; and
   a wiring level applied onto the planarization layer, wherein the wiring level comprises:
      a structured conductor path electrically coupled to the functional structure via at least one through-connection, and
      at least one solderable connecting pad arranged on the planarization layer.

2. The component according to claim 1, wherein the functional structure is selected from the group consisting of a microelectromechanical system structure, a micro-acoustic structure, a surface acoustic wave (SAW) structure, a bulk acoustic wave (BAW) structure, and a guided bulk acoustic wave (GBAW) structure.

3. The component according to claim 1, further comprising at least one connecting face arranged externally to the thin-layer covering on the carrier and coupled both to the functional structure and, via the at least one through-connection, to the wiring level.

4. The component according to claim 3, in which the at least one connecting face and the at least one solderable connecting pad are at least one of
present in different numbers,
have a different distribution, or
are spaced horizontally from one another.

5. The component according to claim 1, further comprising one or more circuit components on the planarization layer, wherein the one or more circuit components are coupled to the functional structure and selected from inductances, capacitances, and resistances.

6. The component according to claim 1,
in which a plurality of functional structures working with acoustic waves are respectively covered by a separate thin-layer covering and coupled to form a high frequency (HF) filter, and
in which the coupling of the plurality of functional structures to form the HF filter is at least partially realized in the wiring level.

7. The component of claim 1, wherein the at least one through-connection comprises a material that is metalized.

8. The component of claim 1, wherein the at least one through-connection constitutes a via and comprises metal.

9. A component comprising:
a carrier;
a functional structure above the carrier;
a thin-layer covering spanning across the functional structure and resting above the carrier, wherein:
the thin-layer covering comprises several partial layers,
the partial layers comprise a mechanically stable layer and a sealing layer, and
the mechanically stable layer encloses a cavity above the carrier, in which at least a portion of the functional structure is enclosed;
a planarization layer arranged above the thin-layer covering; and
a wiring level applied onto the planarization layer, wherein the wiring level comprises a structured conductor path electrically coupled to the functional structure via at least one through-connection.

10. A method for producing a component, the method comprising:
arranging a functional structure above a carrier;
covering the functional structure with a thin-layer covering which rests above the carrier;
producing and structuring a planarization layer arranged above the thin-layer covering;
producing a wiring level on the planarization layer, wherein the wiring level comprises a structured conductor path, and wherein:
a metal layer is deposited onto the planarization layer and structured in order to form the wiring level,
an electrically insulating layer is produced above the wiring level and structured such that exposed areas remain, and
a solderable metallization is applied onto the exposed areas in order to produce at least one solderable connecting pad; and
electrically coupling the structured conductor path to the functional structure via at least one through-connection.

11. The method according to claim 10, wherein the planarization layer is either already applied in a planar manner by a planarizing method or applied as an arbitrary, even non-planar, layer and subsequently planarized, and wherein the planarization layer comprises a lacquer, a polymer, or another organic material.

12. The method according to claim 10, in which producing the wiring level comprises producing two metallic partial layers, of which a first one is applied onto an entire surface as a growth layer, wherein a structure of the wiring level is defined by utilizing a photoresist, and wherein a second metallic partial layer is applied as a layer thickness reinforcement of the growth layer in areas free of the photoresist, in which the growth layer is removed in areas next to the structure of the wiring level.

13. The method according to claim 10, in which the at least one solderable connecting pad is produced by applying a solderable metal layer onto corresponding areas of the wiring level, wherein definition of the at least one solderable connecting pad takes place by utilizing photolithography.

* * * * *